United States Patent [19]

Possin

[11] Patent Number: 4,686,553
[45] Date of Patent: Aug. 11, 1987

[54] LOW CAPACITANCE AMORPHOUS SILICON FIELD EFFECT TRANSISTOR STRUCTURE

[75] Inventor: George E. Possin, Schenectady, N.Y.

[73] Assignee: General Electric Company, Schenectady, N.Y.

[21] Appl. No.: 761,921

[22] Filed: Aug. 2, 1985

[51] Int. Cl.[4] .............................................. H01L 29/78
[52] U.S. Cl. ........................................ 357/23.7; 357/4; 357/59
[58] Field of Search ........................ 357/2, 4, 23.7, 59, 357/59 B, 59 E

[56] References Cited

PUBLICATIONS

"Silicon TFTs for Flat Panel Displays", by F. Morin and M. LeContellec, Hewlett Packard Journal, (date unknown).
"Amorphous–Silicon Thin–Film Metal–Oxide–Semiconductor Transistors", by Hiroshi Hayama and Masakiyo Matsumura, *Applied Physics Letters*, vol. 36, No. 9 (May 1980).
"Amorphous Silicon–Silicon Nitride Thin–Film Transistors", by M. J. Powel et al., *Applied Physics Letters*, vol. 38, No. 10 (May 1981).
"Application of Amorphous Silicon Field Effect Transistors in Addressable Liquid Crystal Display Panels", by A. J. Snell et al., *Applied Physics*, vol. 24, pp. 357–362 (1981).
"A TFT-Addressed Liquid Crystal Color Display", by M. Sugata et al. (Oct. 1983), Proceedings of the Third International Display Research Conference, Paper No. 53.
"Amorphous–Silicon TFT Array for LCD Addressing", by M. V. C. Stroomer et al., Electronic Letters, vol. 18, No. 20 (1982).
"High Resolution Transparent-Type a-Si TFT LDCs", by K. Suzuki et al., SID Digest, (1983).
"Promise and Challenge of Thin–Film Silicon Approaches to Active Matrices", by A. I. Lakotos, 1982 International Display Research Conference, IEEE, pp. 146–151.
"Application of Amorphous Silicon Field Effect Transistors in Integrated Circuits", by A. J. Snell et al., *Applied Physics*, vol. A26, pp. 83–86.
den Boer, W., "Determination of Midgap Density of States in a Si:H Using Space–Charge–Limited Current Measurements", *Journal of Physics*, Paris, vol. 42, C4, pp. 451–458 (1981).
Mackenzie, K. D. et al., "The Density of States in Amorphous Silicon Determined by Space–Charge–Limited Current Measurements", *Philosophical Magazine B*, vol. 46, No. 4, pp. 377–389 (1982).
Street, R. A. et al., "Effects of Doping on Transport and Deep Trapping in Hydrogenated Amorphous Silicon", *Applied Physics Letters*, vol. 43, pp. 672–674 (Oct. 1983).
Sze, S. M., "Physics of Semiconductor Devices", 1st Edition, Wiley Interscience, p. 276, 1969.
Snell, A. J. et al., "Application of Amorphous Silicon Field Effect Transistors in Addressable Liquid Crystal Display Panels", *Applied Physics*, vol. 24, pp. 357–362 (1981).
Tuan, H. C. et al., "Dual–Gate a–Si:H Thin Film Transistors", *IEEE Electron Device Letters*, vol. EDL-3(12), pp. 357–359m (1982).

*Primary Examiner*—Joseph E. Clawson, Jr.
*Attorney, Agent, or Firm*—Lawrence D. Cutter; James C. Davis, Jr.; Marvin Snyder

[57] ABSTRACT

An amorphous silicon thin film FET is structured to be particularly useful for use in liquid crystal display circuits. In particular, critical FET dimensions are provided which permit optimal reduction of source to gate capacitance, while at the same time, preventing the occurrence of large contact voltage drops. Critical dimensions include active channel length, source-gate overlap, and amorphous silicon thickness. A critical relationship is established amongst these parameters.

7 Claims, 15 Drawing Figures

LOW CAPACITANCE AMORPHOUS SILICON FIELD EFFECT TRANSISTOR STRUCTURE

BACKGROUND OF THE INVENTION

The present invention is generally related to geometrical structures for amorphous silicon field effect transistors (FETs). More particularly, the present invention is directed to an FET structure with reduced contact overlap which reduces the intrinsic source and gate capacitance and which does not degrade the performance of the device by introducing voltage drops at the source or gate contact. The resulting FET device is particularly useful in matrix addressed liquid crystal displays (LCDs).

Amorphous silicon FETs provide an attractive choice for high contrast flat panel type television displays. These displays typically include liquid crystal material disposed between conductive electrodes arranged in a horizontal and vertical array so as to provide a large plurality of picture elements (pixels). Application of voltages to the electrodes orients the liquid crystal material so as to affect the transmission of light through the material. Since at least one set of electrodes (and its corresponding substrate) is transparent, a visible image is thereby displayed. In the process, each one of the pixel elements operates very much like to an electrical capacitor. In fact, an effective liquid crystal capacitance $C_{LC}$ is associated with each pixel element. Ideally, in a FET addressed liquid crystal display (LCD), when a FET is turned on, the liquid crystal pixel capacitor $C_{LC}$ charges to the data or drain line voltage. When the FET is turned off, the data voltage is stored on $C_{LC}$. However, there are many parasitic capacitances in the display structure which are not negligible when compared to $C_{LC}$. Two important parasitic capacitances are the source to drain capacitance, $C_{SD}$, and the source to gate capacitance, $C_{SG}$ or $C_{GS}$. In particular, the source to gate capacitance is of particular concern herein.

Consider the effect of the source to drain capacitance, $C_{SD}$. The worst case condition is when one element in a column of the display is turned off and all other elements in the column are turned on. In this case, the desired voltage across the pixel element capacitor, $V_{LC}$ should be zero while the voltage $V_{LC}$ across all of the other pixel elements in the column should be $V_O$. The rms voltage on the data line is then approximately $V_O$ and the voltage induced on the "off" pixel element is $\delta V_{LC} = V_O C_{SD}/C_{LC}$. For the off pixel element to remain off, the sum of the induced voltages from this and all other parasitic capacitances must be less than the threshold voltage of the liquid crystal material, namely, $V_{th}$. The effect of $C_{SD}$ on a grayscale display is more critical since if $V_{LC}$ is set at an intermediate level on one pixel ($V_{th} < V_{LC} < V_{max}$), the value of $V_{LC}$ can vary by $<\delta V_{LC}$ depending upon the state of the other elements in the column.

The effect of the gate source capacitance $C_{GS}$ is similar except that voltage waveforms on the gate line couple through $C_{GS}$ to produce an additional undesirable voltage on the pixel electrode. Only the part of the gate line waveform for which the gate voltage is less than the threshold voltage couples through, since, above the threshold voltage, the FET is sufficiently conducting to hold the pixel voltage at the data line voltage.

The parasitic capacitances in an LCD display can be divided into two groups: those that are dependent on the FET structure and those that are dependent upon the overall matrix structure. The parasitic capacitances which depend on the FET structure include the source to drain capacitance and the source to gate capacitance. The parasitic capacitances which are dependent upon the matrix structure include the capacitances between the pixel electrode and the gate and data lines. These latter capacitances are minimized by choosing structures with appropriate address line widths, spacings between address lines, cell thickness, and liquid crystal material. The FET capacitances, which are the ones of primary interest herein, are minimized by making the area of the gate, source, and drain electrodes as small as possible. This leads to FET designs with small overlap area between the gate and the electrode which contacts the indium tin oxide (ITO) pixel.

Conventional thin film FET structures with the contact on the opposite side of the silicon from the induced electron channel have many processing advantages. For LCD devices, it has the additional advantage that the data and scan line crossover insulation is obtained without extra processing. However, this structure can result in reduced drain currents and a contact voltage drop which complicates applications to gray scale displays. The nature of this contact structure also requires larger contact area which undesirably increases the parasitic capacitances associated with such FET devices.

Plots of drain currents versus drain voltage for conventional FET devices generally indicate non-ideal characteristics at low drain voltages. At these voltages, the dependence is nearly parabolic resulting in a non-exponential charging characteristic for the LCD pixel capacitor. An ideal device is generally linear in the drain voltage versus source voltage characteristic at low drain voltages. Non-ideal behavior results in the introduction of a contact drop voltage, $V_c$. This drop is undesirable. However, the effect that the contact drop has on decreasing the drain current in the FET is less obvious. The contact drop at higher drain currents is generally larger than $V_c$. This reduces the actual gate and drain voltages applied to the internal device structure and hence reduces the drain current compared to that which would be otherwise obtainable.

In order to minimize the source to gate capacitance, $C_{SG}$, it is generally desired to correspondingly reduce the overlap between the source and gate electrodes. However, this reduction results in an increase in the contact drop $V_c$.

Accordingly, it is an object of the present invention to provide amorphous silicon FETs which strike a critical balance between minimum parasitic capacitance and control of contact voltage drop.

It is also an object of the present invention to provide FET structures which are useful in liquid crystal display devices, particularly in gray scale level devices.

It is also an object of the present invention to reduce the parasitic source to gate capacitance in a thin film FET device It is yet another object of the present invention to reduce contact voltage drops in thin film FET devices.

Lastly, but not limited hereto, it is an object of the present invention to achieve improved performance in amorphous silicon FETs by selectively reducing the thickness of the amorphous silicon layer in conjunction with control of overlap dimensions for the source and gate electrodes.

SUMMARY OF THE INVENTION

In a preferred embodiment of the present invention, an amorphous silicon thin film FET comprises an insulating substrate, a gate electrode disposed on this substrate, an insulating layer disposed over the gate electrode, an amorphous silicon layer disposed over the insulating layer and possessing a thickness t. The FET also comprises a drain electrode disposed on the amorphous silicon layer so as to partially overlap the gate electrode. Additionally, a source electrode is disposed on the amorphous silicon layer so as to define a channel region of length L in the amorphous silicon layer and wherein the source and gate electrodes overlay by a distance d. In the present invention, the overlap distance is approximately given by $d_{cc} = c\mu_e/(2L\alpha)$ wherein c is the gate capacitance per unit area, $\mu_e$ is the effective electron mobility in the amorphous silicon, and $\alpha$ is the ratio between current density J in the direction from the gate electrode to the source electrode in the region of their overlap and also the gate voltage raised to the power n where here n is 2 (see also equation 16 below and the discussion preceding equation 11). More particularly, c is the dielectric constant associated with the insulating layer divided by the thickness of the insulating layer, h.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
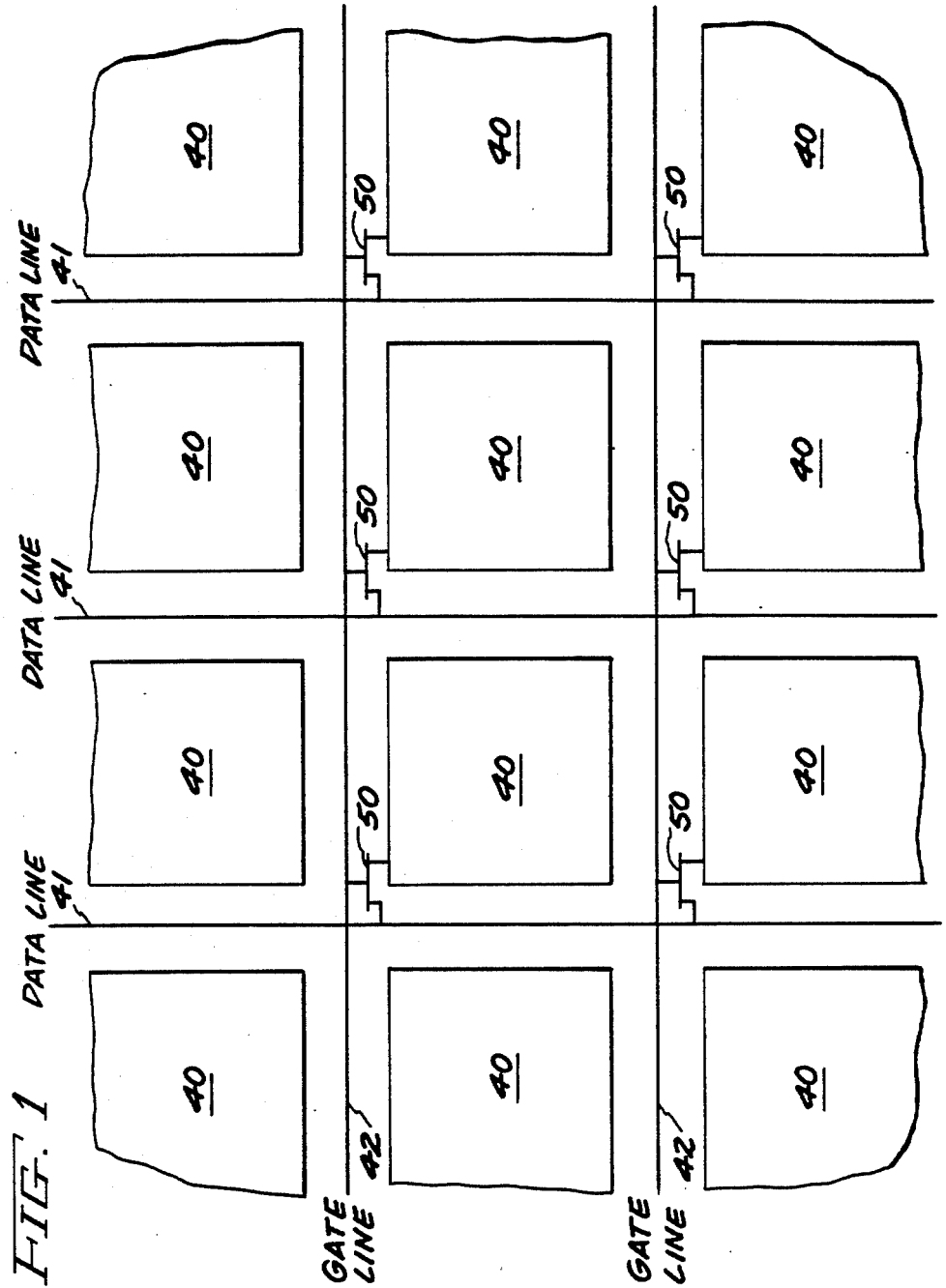
FIG. 1 is a schematic diagram illustrating the use of FETs in a matrix addressed liquid crystal displays.

The amorphous silicon thin film field effect transistors of the present invention are particularly useful in liquid crystal display devices. In particular, the devices of the present invention exhibit reduced capacitive effects and contact voltage drop effects which are advantageous in these devices. A schematic diagram of a conventional matrix addressed liquid crystal display is illustrated in FIG. 1. In particular, FETs 50 are shown connected to (usually transparent) pixel electrodes 40. Each FET 50 is connected to one of a plurality of gate lines 42. Likewise, each FET 50 has its drain electrode connected to a data line 41. Accordingly, the source electrode for each FET is typically connected to the pixel electrode. The conventional arrangement is to dispose the pixel elements in the form of a rectangular grid, a portion of which is illustrated in FIG. 1. Accordingly, FIG. 1 provides a context in which the device of the present invention is employable.

Figure 2:
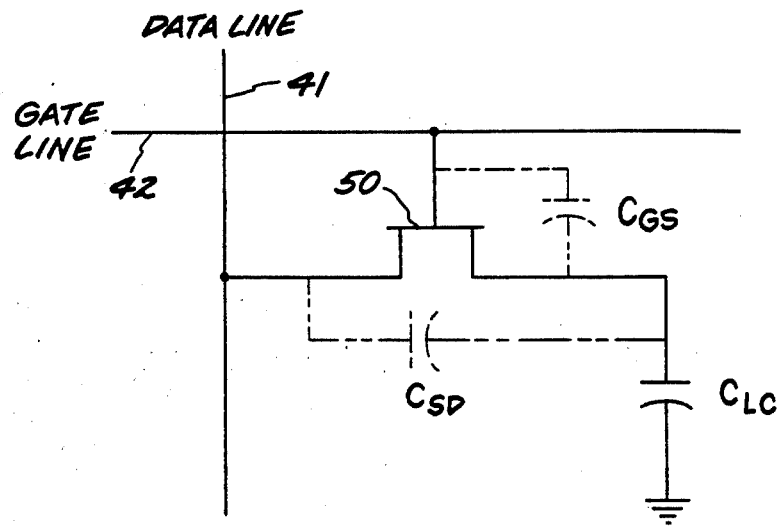
FIG. 2 is a schematic diagram illustrating the presence of parasitic capacitances (shown in phantom) in an FET device, particularly one employed in a liquid crystal display.

As indicated above, there nonetheless exists a problem of parasitic capacitance in FET devices. In particular, the problems addressed in the present application are directed to the parasitic capacitance which exists between the source and the gate electrodes in a thin film amorphous silicon FET. An electrical schematic diagram illustrating the presence of these parasitic capacitances (shown in phantom) is provided in FIG. 2. The parasitic capacitances $C_{GS}$ and $C_{SD}$ exist in the circuit in addition to the effective capacitance $C_{LC}$ which is present as a result of disposing liquid crystal material between conductive electrodes.

Figure 3:
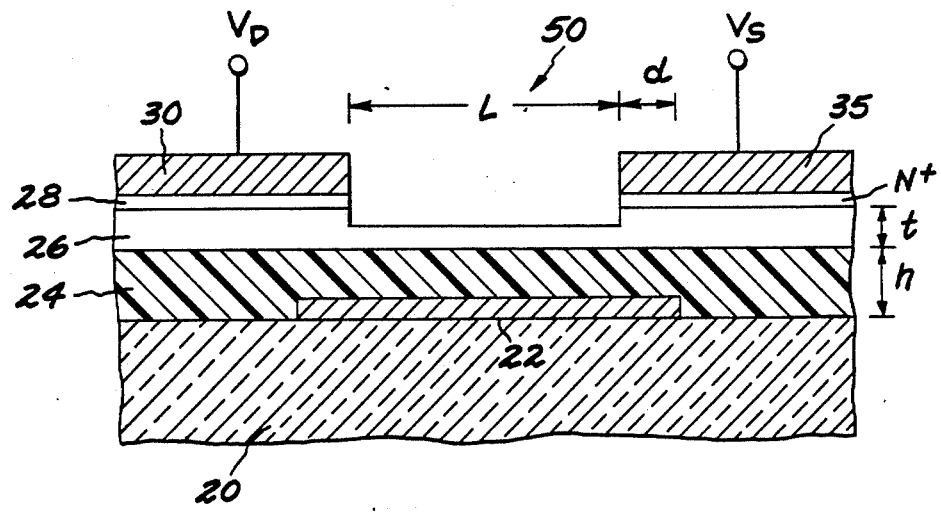
FIG. 3 is a cross sectional side elevation view illustrating the physical structure and dimensions of a typical thin film FET.

Amorphous silicon FET devices for use in liquid crystal displays are well known in the art. However, the present invention is related to FET structures which exhibit certain critical dimensional criteria. The physical dimensions involved are illustrated in FIG. 3 which is a cross sectional view of a conventional thin film FET. In particular, conductive gate electrode 22 is typically deposited on insulative substrate 20 comprising material such as glass. A layer 24 of insulating material such as silicon nitride is then deposited over the gate electrode and a portion of the underlying substrate 20 and functions as gate insulation material. Next, a layer of amorphous silicon 26 is deposited over insulating layer 24. The hydrogenated silicon and silicon nitride films are produced by conventional plasma enhanced chemical vapor deposition at plasma frequencies of approximately 50 kHz to 13 MHz. Silane, $SiH_4$, diluted with 90% argon is used for silicon depositions and a combination of silane and ammonia is used for the nitride depositions. In order to provide N+ doped layer 28, 1% phosphine, $PH_3$, in argon diluted silane is used. Helium, Neon or no dilution can also be used. The N+ silicon, the intrinsic silicon and nitride thicknesses are typically 50 nanometers, 200 nanometers, and 150 nanometers, respectively. The conductivity of the N+ layer can be as high as $10^{-2}$ mho per centimeter at 20° C. with an activation energy of 0.21 electron volts (eV). The contact metal for drain electrode 30 and source electrode 35 may comprise sputter-deposited molybdenum. The N+ layer is removed from the channel region by barrel plasma etching in an atmosphere of carbon tetrafluoride, $CF_4$, combined with 8% oxygen. However, it is noted that the present invention is not limited to these specific processes, compositions, methods or ranges.

A proper understanding of the present invention, however, requires consideration of specific dimensional aspects shown in FIG. 3. In particular, spacing between source electrode 35 and drain electrode 30 is such as to provide a channel region having a length L. This is an important dimension in the practice of the present invention. Additionally, it is seen that the source and the gate electrode overlap one another by a distance d, as shown. Also, it is seen that amorphous silicon layer 26 possesses thickness t. This thickness is directly related to the parameter $a$ which is described below (see equation 16). Another dimension is the thickness h of insulating layer 24. In the sense that layer 24 comprises dielectric material disposed between source and gate electrodes, it possesses a certain capacitance c per unit area wherein $c = \epsilon_s/h$ wherein $\epsilon_s$ is the dielectric constant associated with layer 24. In fact, for proper operation, the present application teaches that these dimensions are critically related. See equation 15 below. In the present invention, c is approximately $4 \times 10^{-8}$ farads/cm$^2$.

Figure 6:
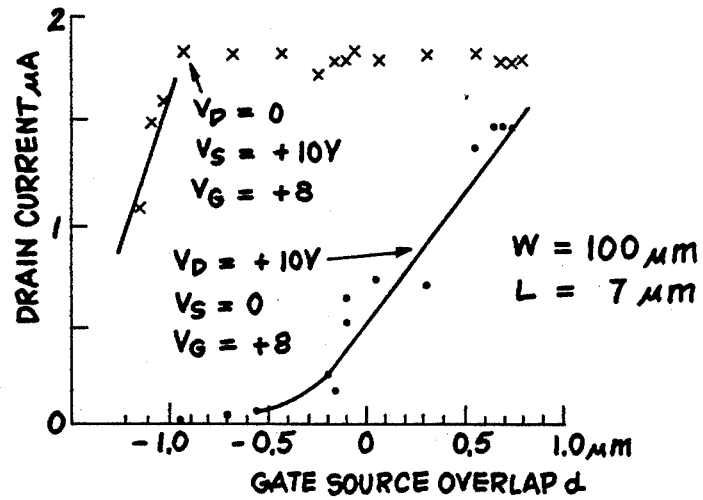
FIG. 6 is a plot of drain current versus source or drain overlap distance d.

As indicated above, one of the significant parameters in the geometric configuration of the present invention is the overlap distance d between the source and the gate. This overlap has a definite effect on the drain current. This fact is indicated in FIG. 6. The lower curve in FIG. 6 is the measured drain current at $V_G = 8$ volts and $V_D = 10$ volts as a function of the source overlap distance d, for an FET with a gate electrode width W of 100 microns and a channel length L of 7 microns. The drain electrode has a larger overlap which is greater than 2 microns. Also shown in FIG. 6 is the drain current with the driving voltage reversed so that the side of the device with the small overlap becomes the drain. Since in saturation, the channel field collapse is near the drain electrode, overlap near the drain can actually be negative before the drain current is reduced. In FIG. 6, the filled-in dots represent experimental data obtained for source overlap and the x's represent data obtained for drain overlap. The data in FIG. 6 was obtained using a device similar to that shown in FIG. 3.

Figure 7:
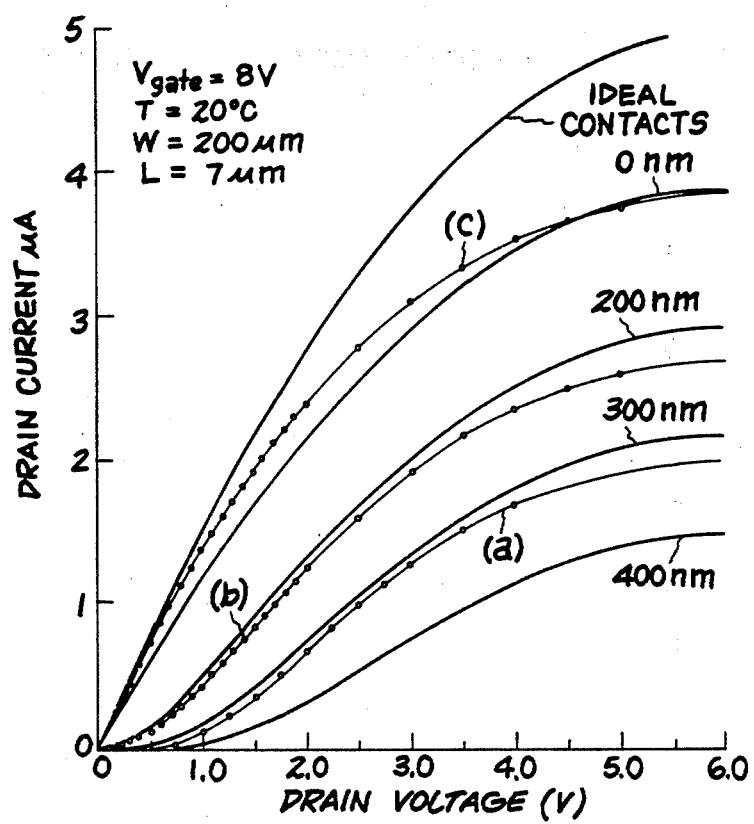
FIG. 7 is a plot of calculated and measured drain current versus drain voltage at a gate voltage of 8 volts.

FIG. 7 shows the drain current versus drain voltage characteristic for several devices. The solid curves shown in FIG. 7 are for model calculations described below. The circles represent experimental data measurements. The non-ideal characteristic at low drain voltages, which is nearly parabolic, results in a non-exponential charging characteristic for the LCD pixel capacitor $C_{LC}$. For matrix addressed displays with gray scale, the voltage on the pixel capacitor must be set within a few tenths of a volt out of a total applied voltage of 5 volts (typical). Because of the non-ideal drain characteristic, the charging time to within the required 5% or less of the applied voltage can be larger than the allowed dwell time of about $10^{-5}$ second in typical displays. While the failure to completely settle can be compensated by a voltage offset, variations in the contact drop behavior across the display are still a problem. Hence, it is desirable to understand and minimize this contact drop behavior. Both the reduction in ON current with decreasing overlap and this contact drop are clearly related phenomena. Voltage drop at the source contact both decreases the effective internal gate to source voltage and the internal drain to source voltage.

Figure 4:
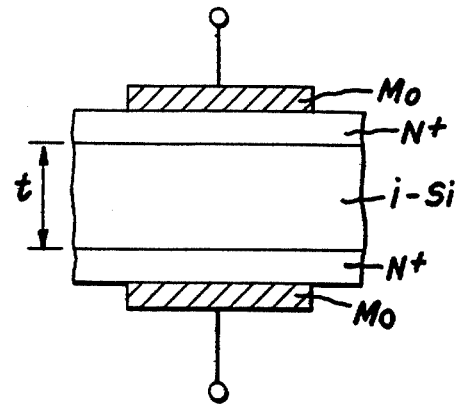
FIG. 4 is a cross sectional side elevation view of an equivalent device employed experimentally herein to test certain parameter relationships.

In an attempt to understand and minimize this voltage drop behavior, the current voltage characteristics of the metal N+ contact, the N+/intrinsic silicon structure, and the influence of silicon layer thickness and doping on the voltage drop and ON currents have been investigated. The structure employed for this investigation is illustrated in FIG. 4. In this experimental configuration, molybdenum contacts were employed on opposite sides of a 500 nanometer thick layer of nearly intrinsic silicon (i-Si). The intrinsic silicon also included a 50 nanometer thick layer of N+ doped silicon on either side thereof in contact with the molybdenum electrode. The contact structure can be modeled as an n-i-n structure. Current through this structure can be limited by contact resistance at the molybdenum/N+ interface or by space-charge-limited current flow through the intrinsic layer. The conductivity of the N+ layer, which is $7 \times 10^{-3}$ mho/cm is too high to be a limitation.

The current-voltage characteristics of the Mo/N+/Mo structures are nearly linear and well fit by the relation: $J_C = bV$ where $b = 1.9 \times 10^6$ A/V-cm$^2$ exp $(-0.33$ eV/kT$)$. Here, T is temperature and k is Boltzmann's constant. This characteristic cannot be explained by the N+ material which has a factor of 100 higher conductivity, namely $7 \times 10^{-3}$ mho/cm, and a lower activation energy of 0.21 electron volts. Hence, this is an inherent limitation of the Mo/N+ contact. Mo/N+/Mo structures fabricated using different deposition conditions for the N+ layer exhibit slightly different characteristics. These different fabrication conditions include the radio frequency power or argon dilution.

Figure 8:
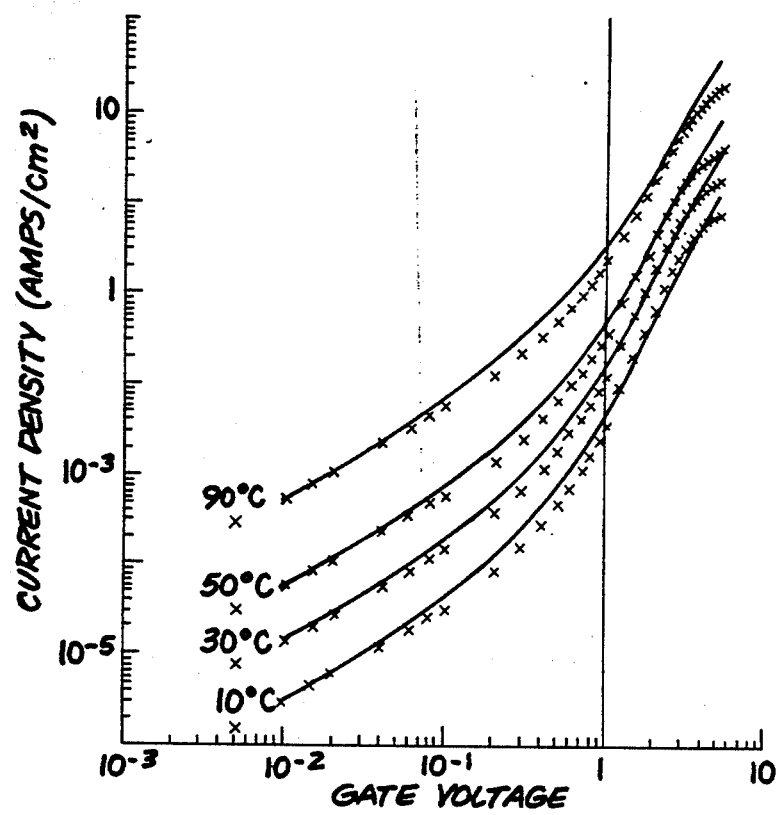
FIG. 8 is a plot of measured current density versus voltage and temperature for the structure illustrated in FIG. 4.
Figure 9:
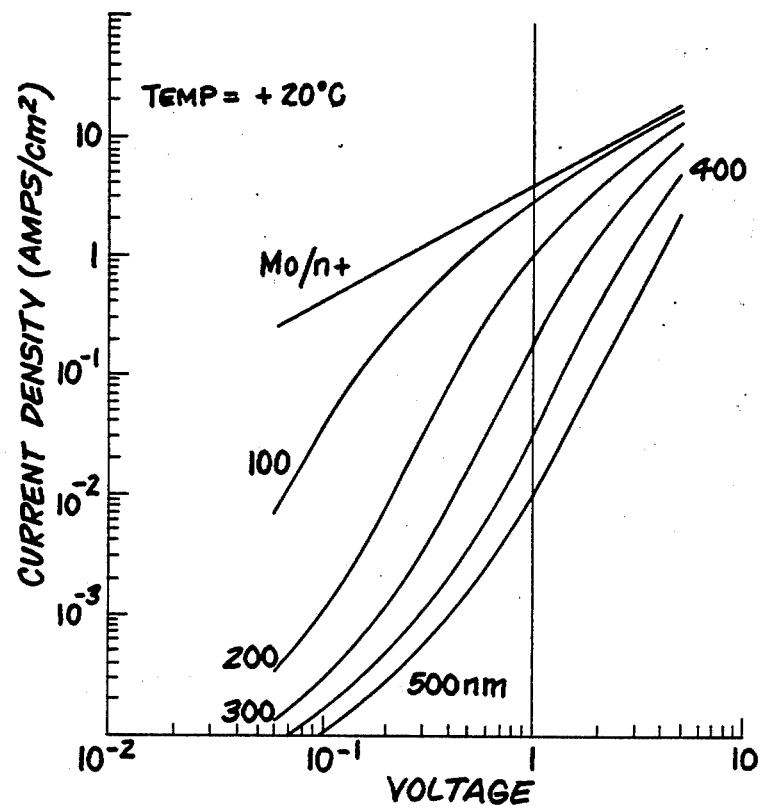
FIG. 9 is a plot of contact current density versus contact voltage drop for several silicon thicknesses at a temperature of 20° C.

FIG. 8 shows the measured current voltage characteristic at several temperatures. This data has been corrected for the voltage drop at the Mo/N+ interface. The points shown are experimental data and the solid lines are a fit to the data. Only one polarity is shown in FIG. 8, but the curves for the opposite polarity case are symmetric. The behavior up to about 3 volts can be understood as space-charge-limited current flow in the intrinsic layer. Modeling and experimental data on space-charge-limited flow in amorphous silicon (a-Si) structures has been discussed in the art. See W. Den Boer, J. Phys. Paris, Volume 42, C4, Page 451 (1981) and K. D. Mackenzie, P. G. Le Comber, and W. E. Spear, Phil. Mag., Volume B46, pp. 377–389 (1982). At very low voltages the current is ohmic and the magnitude and temperature dependence correspond to the bulk conductivity of the intrinsic layer with $\sigma_O = 308$ mho/cm and an activation energy of 0.58 electron volts. This indicates that the intrinsic layer is not depleted at small applied fields. This is consistent with the trap density of $5 \times 10^{16}$ #/cm$^3$/eV determined from the magnitude of the space-charge-limited current at higher applied voltages. This trap density implies a screening length of 115 nm or less than 25% of the film thickness. At higher voltages, the dependence becomes quadratic in V, which is characteristic of simple constant trap density space-charge-limited flow, with still higher powers of V at larger voltages, as the quasi-Fermi level enters the non-uniform trap density region. The trap density can be determined from the space-charge-limited currents. For the data FIG. 8, it is $5 \times 10^{16}$ #/cm$^3$/eV near the equilibrium Fermi level. Fitting this data to a polynomial results in the following equation:

$$J_{sc} = a_1(T)V/t + a_2(T)V^2/t^3 + a_4(T)V^4/t^7 \qquad (1)$$

where the coefficients $a_i$ are all of the form $a_i = a_{iO} \exp(-E_{iO}/kT)$ with experimental prefactors $a_{iO}$ of 308, $7.7 \times 10^{-7}$, and $3.4 \times 10^{-3}$ and activation energies $E_{iO}$ of 0.58, 0.54, and 0.4 electron volts, respectively. The values of a, $A_2$ and $A_4$ assume units of volts, cm, and A/cm$_2$ for V, t and $J_{sc}$, respectively. In the above, T is the temperature measured in degrees Kelvin and k is Boltzmann's constant. The form of equation 1 assumes the scaling law for space-charge-limited current $J/t = V/t^2$ so it can be applied to other thicknesses of intrinsic silicon, t, assuming the same material properties. FIG. 9 shows the current density-voltage characteristics of Mo/N+/i-Si contacts as determined from separately measured characteristics of Mo/N+ and N+/i-Si structures. The Mo/N+ curves are determined from $J_c - bV$, as above, and are due only to drops from the Mo/N+ interface (that is with zero thickness of intrinsic silicon.

Using the standard gradual channel approximation for the FET characteristic and the approximation that the channel conductance is proportional to the local field, the effect of the contact voltage drop on FET characteristics can be modeled. If the FET is in saturation, the channel current is given by:

$$I_D = 0.5(W/L)c\mu_e(V_G - V_T - V_{sc})^2 \qquad (2)$$

where $V_{sc}$ is the voltage drop between the channel at the edge of the source contact and the metal of the source contact and $V_T$ is the threshold voltage. In materials employed in the present invention, $\mu_e$, the electron mobility is typically between about 0.5 and 0.8 cm$^2$/volt-sec. In saturation, contact voltage drop is important only at the lowest voltage contact (source) because of the very high electric fields near the drain electrode. The contact voltage drop at the source contact $V_{sc}$ is determined by:

$$I_D = J_c(V_{sc})Wd_c \qquad (3)$$

where $d_c$ is an effective contact overlap distance and $J_c$ is the current density at the edge of the contact nearest the channel. For very small contact overlap distances, $d_c = d$. For larger contact overlap, the current distribution under the contact must be calculated and an effective $d_c$ determined from the contact current distribution. $d_c$ is in general not constant for a given FET structure, but depends upon gate and drain bias. However, it is approximately constant and is a useful quantity because it provides physical insight.

Figure 5:
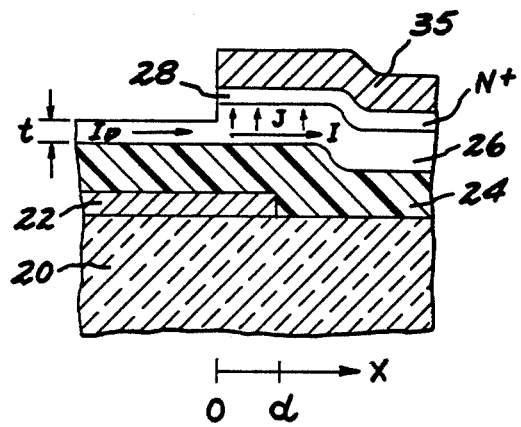
FIG. 5 is a cross sectional side elevation view of an enlarged portion of FIG. 3 so as to more particularly illustrate vertical current density J.

Three methods of determining $d_c$, and the dependence of drain current on actual overlap d, are considered. First the distance scale of the current fall-off under the contact can be estimated from the following:

$$d_c^{-1} = 2(1/J)(\delta J/\delta x) = (1/J)(\delta J/\delta V)\delta V/\delta x( \qquad (4)$$

where x is the distance along the channel and under the contact and all quantities are evaluated at the edge of the contact nearest the channel. See FIG. 5. V is the voltage along the channel both under the contact and in the FET channel. J is the current density across the contact. The formulation is an approximation assuming that the thickness of the silicon is thin compared to the lateral distance scale. The factor of 2 defines $d_c$ so that the total contact current is approximately $d_cJ_O$, where $J_O$ is the current density at the edge of the contact. If the FET is in saturation, the channel current is obtained from equation 2 and the current at the edge of the source contact is given by the following:

$$I_D = W(\delta V/\delta x)c\mu_e(V_G - V_T - V_{sc}) \qquad (5)$$

For all simulations, $c = 3.8 \times 10^{-8}$ farads/cm$^2$, $\mu_e = 0.26$ cm$^2$/volt-sec, and $V_T = 2V$. Equating these two equal currents yields the derivative of V and therefore the estimate for the maximum effective contact distance, namely:

$$d_{cc} = (L/(V_G - V_T - V_{sc}))(V_{sc}/n) \qquad (6)$$

where n is the power law slope of the contact current density at $V = V_{sc}$. In this regard, see FIG. 9. The second term is of the order unity and for typical values of the other parameters, $d_{cc}$ is approximately 2 microns. This estimate is in reasonable agreement with FIG. 6 when maximum drain current is reached for an overlap distance of approximately 1 micron. Hence, contact overlap distances greater than 1 to 2 microns have little effect on the contact voltage drop or the drain current. The conclusion is verified by more exact modeling presented below.

A more exact method is to calculate the current distribution under the contact for finite contact overlap. The channel current $I_D$ is given by the standard equations:

$$I_D(0) = \frac{0.5 W}{L} c\mu_e(V_G - V_T - V(0))^2 \text{ for } V_G - V_T < V_D \qquad (7a)$$

$$I_D(0) = \frac{W}{L} c\mu_e(V_G - V_T - V(0))(V_D - V(0)) - \qquad (7b)$$
$$0.5(V_D - V(0))^2 \text{ for } V_G - V_T > V_D$$

In the approximation that the silicon film is thin compared to the lateral dimensions, the following equation holds:

$$\frac{\partial I}{\partial x} = -WJ(V(x)), \qquad (8)$$

where J is taken from FIG. 9. The lateral current I(x) flowing in the channel under the contact is related to the voltage V(x) under the contact by the following:

$$I(x) = -W\frac{\partial V}{\partial x} G(V_G - V(x)), \qquad (9)$$

where, $G(V) = \mu_e cV$. This form for the sheet conductance G of the FET channel is an approximation which is satisfactory in strong accumulation, but may not be adequate near threshold. It is the form of the conductance that leads to equation 7. These three equations can be combined into a pair of first and second order equations:

$$\frac{\partial^2 V}{\partial x^2} = (J(V(x))/c\mu_e) + \left[\frac{I(x)}{Wc\mu_e V}\right]^2 /V, \qquad (10a)$$

-continued where $$V' = (V_G - V_T - V(x)) \quad (10b)$$

and $$\frac{\partial V}{\partial x} = \frac{-I(x)}{W} c\mu_e(V_G - V_T - V(x)). \quad (10c)$$

Figure 10:
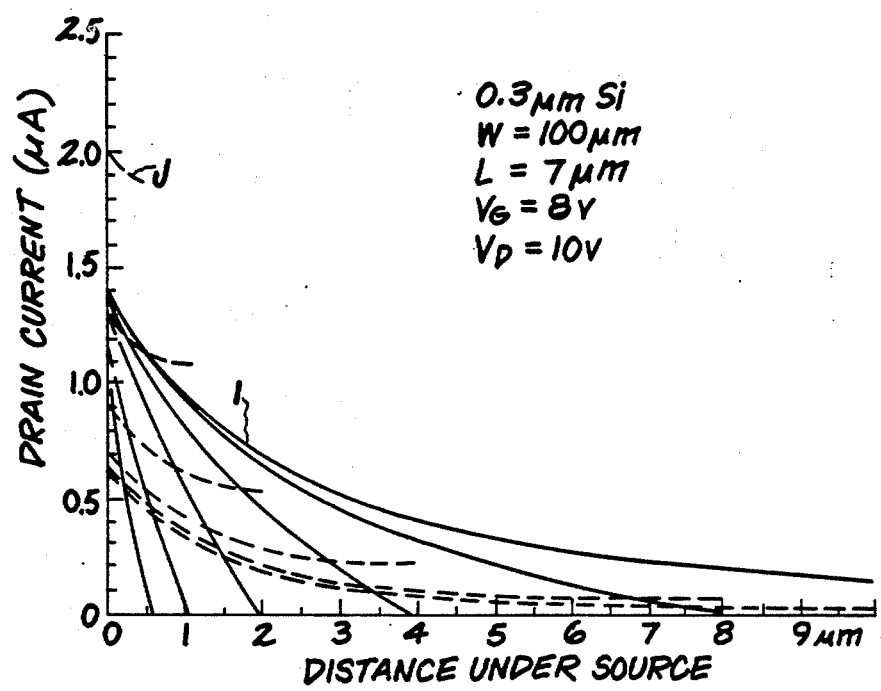
FIG. 10 is a plot of calculated lateral current, I and vertical current density, J for various overlap distances.
Figure 11:
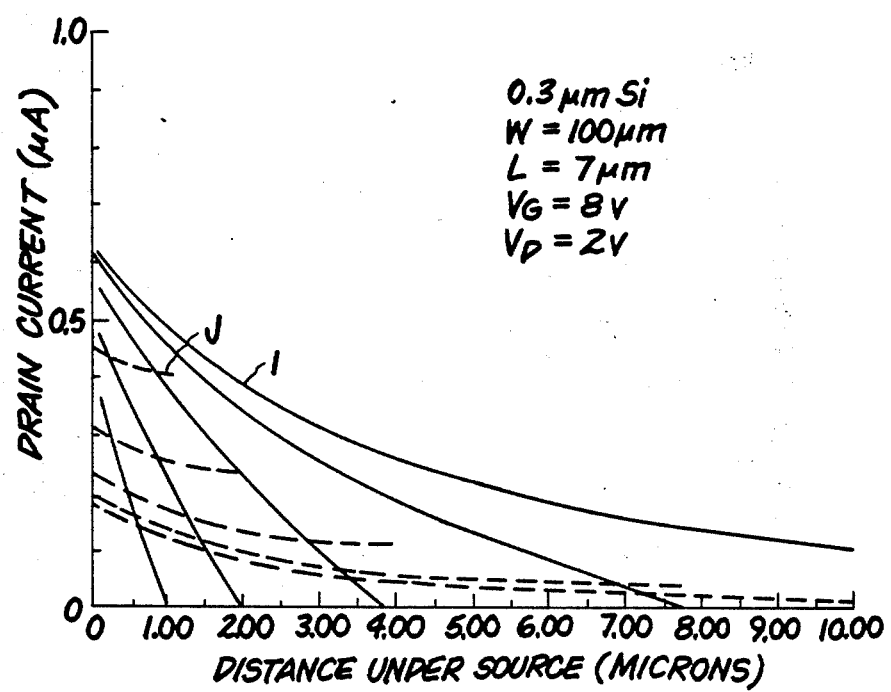
FIG. 11 is a plot similar to FIG. 10 except that the drain voltage herein is 2 volts instead of 10 volts.
Figure 12:
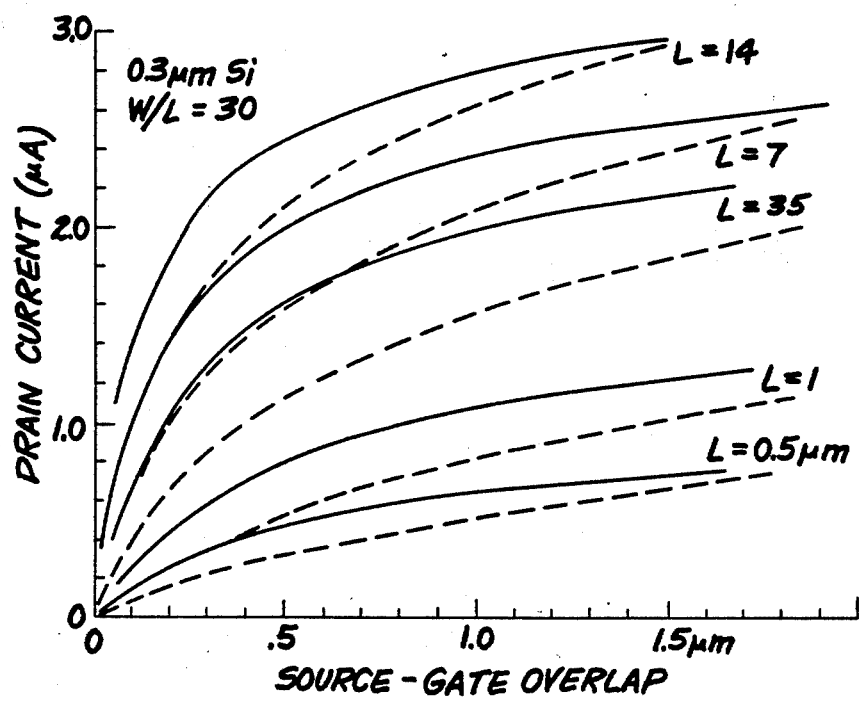
FIG. 12 is a plot of calculated drain current (solid lines) versus source contact distance overlap for various channel lengths L, with dotted curves showing a quadratic approximation to the contact limited current for small overlap.
Figure 13:
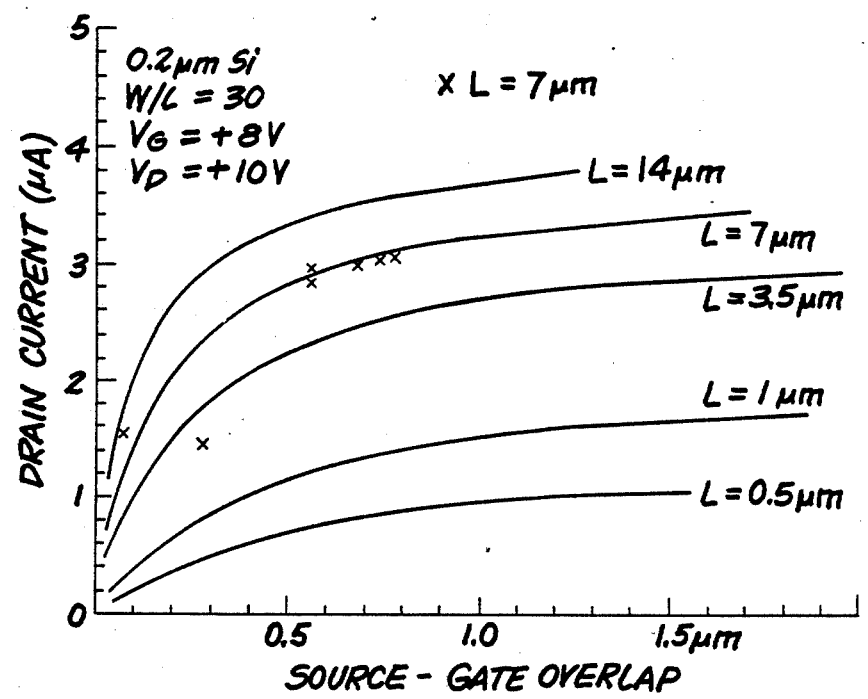
FIG. 13 is a plot of calculated drain current versus source overlap for the same conditions as FIG. 12 except for a silicon thickness of 0.2 microns instead of a thickness of 0.3 microns as in FIG. 12.

These can be solved for V(x), I(x), and J(x) using forward iteration and a second order Taylor series for V(x). The starting boundary condition, $V(x)=V_{sc}$ is the contact voltage drop. This is varied to achieve I(d)=0, where d is the contact overlap distance. This approximation assumes the contact current abruptly terminates at the edge of the gate boundary. This approximation is in the same spirit as the separation of the vertical, J, and lateral, I, currents, (see FIG. 5) and is valid if the silicon thickness is small compared to the contact overlap. FIG. 10 shows the contact current density, J (dashed curves) and lateral current, I (solid curves) for contact overlap distances of 0.5, 1, 2, 3.8, 8, and 20 microns. The vertical scale applies only to the lateral current I. The scale for the current density J is in arbitrary units. The silicon thickness is 300 nanometers and the temperature is 20° C. In the present invention the amorphous silicon layer is preferably less than 300 nm in thickness and even more preferably about 150 nm thick. Other parameters are indicated in FIG. 10. The drain current without any contact drop is 2.5 micro-amperes. For overlap less than 1 micron, the contact current density is almost independent of x, but increases as d decreases. This fact is the basis of a useful approximation discussed below. Note that the drain current is almost independent of the overlap for overlap distances greater than 1 micron. This is in spite of the fact that as the contact overlap increases, there is significant current flow under the contact at large distances from the source edge. The reason for this is traceable to the high degree of nonlinearity in the contact current. FIG. 11 shows a similar calculation for a reduced drain voltage of 2 volts. Even though the device is out of saturation, the basic shape of the curves is similar. FIG. 12 shows the channel current $I_D$ versus the contact overlap d for the same conditions as in FIG. 10. FIG. 13 shows similar calculations for 0.2 micron silicon thickness and includes the data from FIG. 6. The channel length for the devices of FIG. 6 is 7 microns. There is reasonable agreement considering the difficulty in estimating such small overlaps optically. For d<0, the model predicts no drain current, however, fringing fields do permit some current flow even for negative overlaps. The simple one-dimensional model cannot treat these effects. However, the model does quite accurately predict the 1 micron characteristic overlap distance seen experimentally.

FIGS. 12 and 13 show that contact voltage drop is a very significant problem for shorter channel FETs. For L=0.5 microns the ON current is 15% of the maximum possible value without contact voltage drop for a silicon thickness of 0.3 microns. The exact reduction in ON current depends on the silicon thickness and silicon quality (trap density) but the effect of contact voltage drop is always more severe for shorter channel lengths.

As mentioned previously in regard to FIGS. and 11, the intensity of the drain current for contact overlaps greater than 1 micron does not mean there is insignificant contact current flow at distances greater than 1 micron for larger contact overlaps. This paradoxical result is due to the strong dependence of contact current on voltage.

Based on the observation that for small overlap the contact current density is nearly uniform between x=0 and x=d, a closed-form expression for the channel current at small overlap can be obtained. In this approximation, J=J(V(O)) and $I_D$=J(V(O))Wd. These two equations and equation 2 are solved for V(O) =$V_{SC}$ and $I_D$ for certain approximations to J. If J=$\alpha V^n$, where n=2 or 4, then $$I_D = \frac{W}{L} c\mu_e(V_G - V_T - V(0))^2 \quad (11)$$

where:

$$V(O)=(((1-4\mu(V_T-V_G))^{\frac{1}{2}}-1)/2\mu \quad n=4 \quad (12)$$

or $$V(O)=(V_G-V_T)/(\mu+1) \quad n=2 \quad (13)$$

and $$\mu^2=(Ld\alpha)/(c\mu_e) \quad (14)$$

In equation 14, $\alpha$ can be estimated from FIG. 9 depending upon the contact current density. The dotted curves in FIG. 12 are this approximation with n=2 and $\alpha$=0.2 A/cm²/volt². This approximation is good enough to be useful. It fails for small overlap because J is better fit by n=3 in this region. This approximation can be used to estimate the slope of $I_D$ versus overlap, d. Using this slope from equations 11 and 3 with n=2, a critical contact overlap $d_{cc}=I_{DO}/(\delta I_D/\delta d)$ is defined, where $I_{DO}$ is the drain current for zero contact voltage drop. A significant conclusion is the fact that $d_{cc}$ is related to FET geometry by the following approximation:

$$d_{cc} = c\frac{\mu_e}{2L\alpha} \quad (15)$$

For overlap distances much larger than $d_{cc}$, the channel current in saturation becomes independent of contact overlap. This approximation shows the significant dependencies of the minimum contact overlap distance on the device and material parameters. When applying this formula, it should be verified that the region of operation remains within the region where J can be approximated as a quadratic function.

While the discussion above indicates a method for determining $\alpha$ experimentally, it can also be shown that $\alpha$ is related to the thickness and trap density of the undoped or lightly doped silicon layer in the following way:

$$\alpha = \frac{N_e}{N_t} \epsilon_0 \epsilon \mu_e \exp[-(E_c - E_{fn})/(kT)]\frac{1}{t^3}, \quad (16)$$

where $N_e$ is the equivalent density of conduction band states and $N_t$ is the density of mid gap states. $\delta$ is the relative dielectric constant which for silicon is approximately 12.8. $\delta_O$ is the dielectric constant of free space. The difference $E_c-E_{fn}$ is the distance of quasi-Fermi levels from the conduction band edge. To a good approximation, $E_{fn}=E_f$ where $E_f$ is the Fermi level. As above, $\mu_e$ is the electron mobility in amorphous silicon. For amorphous silicon and most semiconductors, $N_e$ is approximately $10^{21}$ #/cm$^3$. For good amorphous silicon, $N_t$ is typically between approximately $10^{15}$ and $10^{17}$ #/cm$^2$/electron-volt. In general, it is seen that $\alpha$ is a material dependent property.

Figure 14:
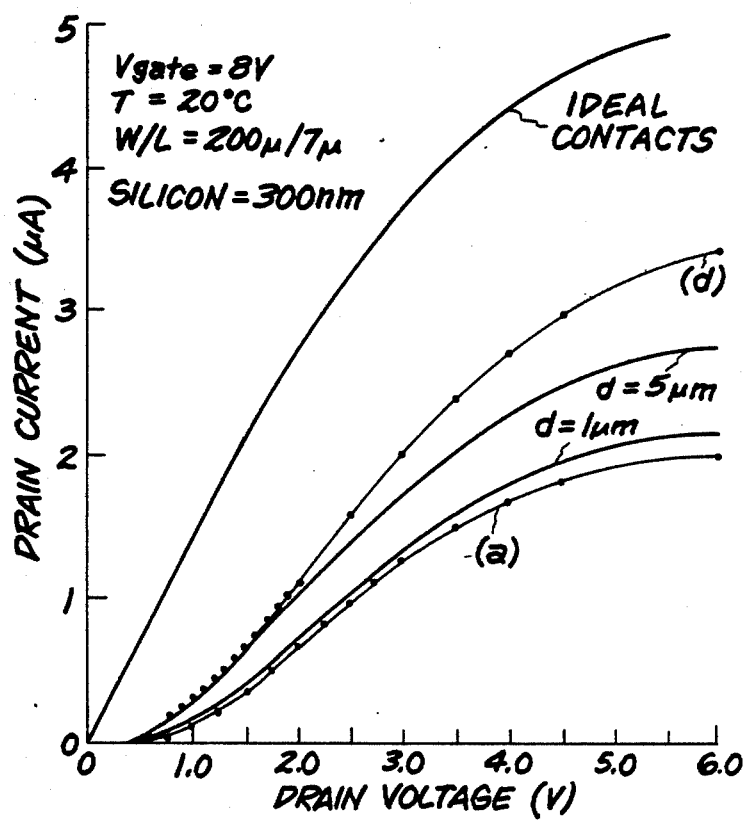
FIG. 14 is a plot of calculated (solid) and measured drain current versus drain voltage characteristics at a gate voltage of 8 volts.

Note though that $\alpha$ is inversely proportional to $N_t$ so that better amorphous silicon material with a lower density of states in the gap has a smaller 60 and therefore a smaller $d_{cc}$. Also note that the as material is doped with phosphorous or other N-type dopant, the difference $E_c-E_f$ is reduced. For a 0.1 electron volt change in $E_c-E_f$, $\alpha$ increases 47 times at room temperature. The heavy solid curves in FIGS. 7 and 14 are simulations of the drain current versus drain voltage using the exact model (equation 10). Essentially equivalent results are obtained by calculating the drain current versus overlap using the exact model at one bias (for example, see FIG. 12) and by using this current to choose an effective overlap, $d_c$, which fits the approximate model (equations 3 and 7). In FIG. 7 note the significant effect of the intrinsic silicon layer thickness on the maximum ON current and also the contact voltage drop behavior at low drain voltages. The theoretical device with a zero intrinsic silicon thickness assumes only the voltage drop due to the Mo/N+ interface. The ideal contact curve assumes no voltage drop at the contacts. FIGS. 7 and 14 also show some experimental data for FETs with different intrinsic silicon thickness and dopings. All devices have L=7 microns and W=200 microns. Curves (a) and (d) are for 300 nm thick intrinsic silicon, (b) for 200 nm thick intrinsic silicon and (c) for 200 nm lightly phosphorous-doped silicon with a room temperature conductivity of $2\times10^{-5}$ mho/cm. The contact overlap for these devices is between 1 and 1.5 microns except for curve (d) where it is 5 microns. Curve (d) is the same device structure as curve (a) except the contact overlap is 5 microns. Note the small increase in ON current for this factor of 5 increase in contact overlap. The device with a lightly N-doped active silicon layer, curve (c), behaves like a device which is limited by the Mo/N+ contact and not space-charge-limited conduction. This can be understood from the theory of space-charge-limited currents as due to a change in the ratio of free to trapped electrons since in the $V^2$ region, the space-charge-limited current should be proportional to $\exp[-(E_c-E_f)/kT]$. Of course, the light doping of the channel tends to increase the OFF currents. However, with the small amount of introduced dopant in the above experiment, OFF currents at $V_G=-5$ volts of less than $10^{-10}$ amperes have been obtained.

Figure 15:
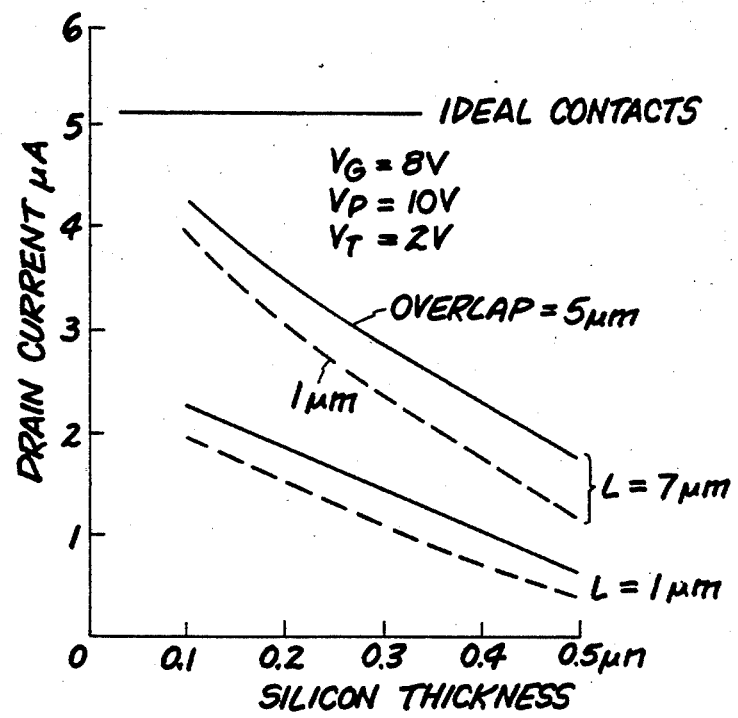
FIG. 15 is a plot of calculated drain current as a function of silicon thickness.

The theory and data in FIG. 7 indicates that a considerable penalty in device performance occurs for intrinsic silicon layers thicker than 300 nanometers. FIG. 15 summarizes this conclusion. It shows exact model calculations based equation 10 and the contact voltage drop data shown in FIG. 9, of the drain current at $V_G=8V$ and $V_D=10V$ versus silicon thickness for two source-gate overlaps. Note the rather small effect of 1 micron versus 5 micron overlap. Below 1 micron, the drain current decreases rapidly. These results are dependent on the quality (mid-gap trap density) and Fermi level of the silicon layer in the channel. Reducing the mid-gap trap density decreases the contact voltage drop. Changes in the Fermi level of the intrinsic silicon layer have an even more dramatic effect. Hence, the critical thickness for device performance degradation depends upon various treatment processes. Whether light N-type doping is useful depends critically on the OFF current requirements for the particular application.

In sum then, it is seen that there is a critical relationship between channel length L, source gate overlap d, and $\alpha$. In particular, it is seen that efforts at decreasing the source, gate overlap to decrease the parasitic capacitance $C_{SG}$ is critically limited by the fact that doing so introduces a voltage drop at the contacts. However, in accordance with the practice of the present invention, maximum silicon thickness and minimum overlap distances are provided in the geometry of the device to reduce this problem to an acceptable value. It is also noted that reducing the silicon thickness to a small value can reduce the contact voltage drop. However, this has undesirable effects on the processing of the devices and on the threshold voltage control. Hence, a silicon thickness as large as possible is usually desirable.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An amorphous silicon thin film field effect transistor, particularly for use in liquid crystal display devices, said field effect transistor comprising:
    an insulating substrate;
    a gate electrode disposed on said insulating substrate;
    an insulating layer disposed over said gate electrode;
    an amorphous silicon layer disposed over said insulating layer, said amorphous silicon layer possessing a thickness t;
    a drain electrode disposed on said amorphous silicon layer so as to partially overlie said gate electrode;
    a source electrode disposed on said amorphous silicon layer so as to define a channel region of length L in said amorphous silicon layer, said channel region extending in said amorphous silicon layer between said source electrode and said drain electrode, said source electrode overlying said gate electrode by a distance d;
    said distance d being given approximately by $c\mu_e/(-2L\alpha)$, where c is the gate capacitance per unit area, $\mu_e$ is the effective electron mobility in the amorphous silicon layer and $\alpha$ is the ratio between current density J in the direction from the gate electrode to the source electrode in the region of their overlap and the gate voltage raised to the power 2.

2. The transistor of claim 1 in which $\alpha$ is approximately 0.2 amperes/cm$^2$/volt$^2$.

3. The transistor of claim 1 in which said thickness t is less than approximately 300 nm.

4. The transistor of claim 1 in which said thickness t is less than approximately 150 nm.

5. The transistor of claim 1 in which $\mu_e$ is between approximately 0.5 cm$^2$/volt and 0.8 cm$^2$/volt.

6. The transistor of claim 1 in which c is approximately $4\times10^{-8}$ farads/cm$^2$.

7. The transistor of claim 1 in which said overlap distance d is less than approximately 1 micron.

* * * * *